United States Patent
Cao (10) Patent No.: US 11,333,946 B2
(45) Date of Patent: May 17, 2022

(54) DISPLAY PANEL AND DISPLAY MODULE

(71) Applicant: SHENZHEN CHINA STAR OPTOELECTRONICS SEMICONDUCTOR DISPLAY TECHNOLOGY CO., LTD., Shenzhen (CN)

(72) Inventor: Wu Cao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 317 days.

(21) Appl. No.: 16/617,002

(22) PCT Filed: May 9, 2019

(86) PCT No.: PCT/CN2019/086106
§ 371 (c)(1),
(2) Date: Nov. 26, 2019

(87) PCT Pub. No.: WO2020/206785
PCT Pub. Date: Oct. 15, 2020

(65) Prior Publication Data
US 2022/0004037 A1    Jan. 6, 2022

(30) Foreign Application Priority Data
Apr. 12, 2019 (CN) .......................... 201910293001.2

(51) Int. Cl.
*G02F 1/1343* (2006.01)
*H01L 27/32* (2006.01)
(Continued)

(52) U.S. Cl.
CPC ...... *G02F 1/1368* (2013.01); *G02F 1/134345* (2021.01); *G02F 1/136227* (2013.01);
(Continued)

(58) Field of Classification Search
CPC . H01L 27/3248; H01L 27/326; G02F 1/1368; G02F 1/134345; G02F 1/136227; G02F 1/136222
(Continued)

(56) References Cited

U.S. PATENT DOCUMENTS 9,128,339 B2 * 9/2015 Lee .................. H01L 27/124
9,588,382 B2 * 3/2017 Qin .................. H01L 27/3213
(Continued)

FOREIGN PATENT DOCUMENTS

CN         101887892 A    11/2010
CN         103048838 A     4/2013
(Continued)

*Primary Examiner* — David Vu
*Assistant Examiner* — Brandon C Fox
(74) *Attorney, Agent, or Firm* — JMB Davis Ben-David (57) ABSTRACT

The present invention provides a display panel and a display module. The display panel comprises at least two pixel units. Each pixel units comprises a substrate, a thin film transistor (TFT) disposed on the substrate, and a pixel electrode disposed on the thin film transistor. The thin film transistor and the pixel electrode disposed in the same pixel unit are insulated from each other. The thin film transistor disposed in the pixel unit is electrically connected to a pixel electrode disposed in another pixel unit, which is disposed parallel to the pixel unit.

18 Claims, 7 Drawing Sheets

(51) Int. Cl.
*G02F 1/1368* (2006.01)
*G02F 1/1362* (2006.01)

(52) U.S. Cl.
CPC ........ *H01L 27/326* (2013.01); *H01L 27/3248* (2013.01); *G02F 1/136222* (2021.01)

(58) Field of Classification Search
USPC ..................................................... 257/72, 79
See application file for complete search history.

(56) References Cited

U.S. PATENT DOCUMENTS

| | | | | |
|---|---|---|---|---|
| 9,659,541 | B2 * | 5/2017 | Jin | ................. G09G 3/3648 |
| 9,916,801 | B2 * | 3/2018 | Lin | ................. G09G 3/3648 |
| 2014/0168045 | A1 | 6/2014 | Jiang | |
| 2014/0217411 | A1 * | 8/2014 | Jiang | .................. H01L 27/124 257/59 |
| 2016/0172623 | A1 * | 6/2016 | Lee | ................... H01L 51/5253 257/40 |
| 2017/0293172 | A1 | 10/2017 | Zhang | |
| 2018/0011371 | A1 * | 1/2018 | Noh | .................. H01L 27/1248 |

FOREIGN PATENT DOCUMENTS

| | | |
|---|---|---|
| CN | 106684101 A | 5/2017 |
| CN | 108319068 A | 7/2018 |
| KR | 20180129330 A | 12/2018 |

\* cited by examiner

DISPLAY PANEL AND DISPLAY MODULE

CROSS-REFERENCE TO RELATED APPLICATIONS

This is the U.S. National Stage of International Patent Application No. PCT/CN2019/086106, filed May 9, 2019, which in turn claims the benefit of Chinese Patent Application No. 201910293001.2, filed Apr. 12, 2019.

FIELD OF INVENTION

The present invention relates to the field of display, and in particular, to a display panel and a display module.

BACKGROUND OF INVENTION

In the prior art, the color filter on array (COA) display panel is provided with the color filter layer on the array substrate, which avoids alignment errors generated by the conventional array substrate and the color filter substrate, and improves alignment precision of the display panel. However, arrangement of the color resist layer causes poor surface flatness of the array substrate, resulting in technical problems such as poor alignment and boundary dark lines, and lowered product yield.

Therefore, there is a need for a display panel to solve the above technical problems.

SUMMARY OF INVENTION

The present invention provides a display panel and a display module to solve the technical problems such as dark lines on the boundary of the existing display panel.

To solve the above solution, the technical solution provided by the present invention is as follows:

The present invention provides a display panel comprising at least two pixel units;

wherein each of the at least two pixel units comprises a substrate, a thin film transistor (TFT) disposed on the substrate, and a pixel electrode disposed on the thin film transistor;

wherein the thin film transistor and the pixel electrode disposed in a same pixel unit are insulated from each other; and wherein the thin film transistor disposed in the same pixel unit is electrically connected to a pixel electrode disposed in another pixel unit, which is disposed parallel to the same pixel unit.

In the display panel of the present invention, a first pixel electrode of a first pixel unit of the at least two pixel units is electrically connected to a second thin film transistor of a second pixel unit of the at least two pixel units, or a second pixel electrode of the second pixel unit is electrically connected to a first thin film transistor of the first pixel unit.

In the display panel of the present invention, at least one first branch electrode of the first pixel electrode extends toward the second thin film transistor and is electrically connected to the second thin film transistor, or at least one second branch electrode of the second pixel electrode extends toward the first thin film transistor and is electrically connected to the first thin film transistor.

In the display panel of the present invention, the first pixel unit and the second pixel unit are disposed parallel to each other in a first direction or a second direction; and wherein the first direction is perpendicular to the second direction.

In the display panel of the present invention, when the first pixel unit and the second pixel unit are disposed parallel to each other in the first direction, a first branch electrode of the first pixel electrode spans across a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the data line disposed between the first pixel unit and the second pixel unit, extends toward the first thin film transistor, and is electrically connected to a source/drain of the first thin film transistor by a first via hole of the first pixel unit.

In the display panel of the present invention, when the first pixel unit and the second pixel unit are disposed parallel to each other in the second direction, a first branch electrode of the first pixel electrode spans across a scanning line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line disposed between the first pixel unit and the second pixel unit, extends toward the first thin film transistor, and is electrically connected to a source/drain of the first thin film transistor by a first via hole of the first pixel unit.

In the display panel of the present invention, a first branch electrode of the first pixel electrode spans across a scanning line and a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line and the data line disposed between the first pixel unit and the second pixel unit, extends toward the first thin film transistor, and is electrically connected to a source/drain of the first thin film transistor by a first via hole of the first pixel unit.

In the display panel of the present invention, the first pixel unit comprises a first color resistance;

the second pixel unit comprises a second color resistance; and the first color resistance and the second color resistance each are one of red color resistance, green color resistance, and blue color resistance.

In the display panel of the present invention, the display panel comprises a display area and a non-display area disposed at a periphery of the display area;

wherein a plurality of thin film transistors are disposed parallel with each other in a first area of the non-display area, the first area is disposed adjacent to the display area, and the first area is parallel to a data line or a scanning line of the display area; and wherein the thin film transistors in the first area are electrically connected to the pixel electrode in the adjacent pixel unit.

In the display panel of the present invention, the display area comprises a second area;

wherein the second area is opposite to and parallel to the first area, and the second area is adjacent to the non-display area and away from the first area;

wherein a plurality of thin film transistors are disposed parallel with each other in the second area; and wherein the thin film transistors in the second area are non-driving thin film transistors.

The present invention further comprises a display module, comprising a display panel and a polarized layer and a cover layer disposed on the display panel, wherein;

the display panel comprises at least two pixel units;

each of the at least two pixel units comprises a substrate, a thin film transistor disposed on the substrate, and a pixel electrode disposed on the thin film transistor;

wherein the thin film transistor and the pixel electrode disposed in a same pixel unit are insulated from each other; and wherein the thin film transistor disposed in the same pixel unit is electrically connected to a pixel electrode disposed in another pixel unit, which is disposed parallel to the same pixel unit.

In the display module of the present invention, a first pixel electrode of a first pixel unit of the at least two pixel units is electrically connected to a second thin film transistor of a second pixel unit of the at least two pixel units, or a second pixel electrode of the second pixel unit is electrically connected to a first thin film transistor of the first pixel unit.

In the display module of the present invention, at least one first branch electrode of the first pixel electrode extends toward the second thin film transistor and is electrically connected to the second thin film transistor, or at least one second branch electrode of the second pixel electrode extends toward the first thin film transistor and is electrically connected to the first thin film transistor.

In the display module of the present invention, the first pixel unit and the second pixel unit are disposed parallel to each other in a first direction or a second direction; and wherein the first direction is perpendicular to the second direction.

In the display module of the present invention, when the first pixel unit and the second pixel unit are disposed parallel to each other in the first direction, the first branch electrode of the first pixel electrode spans across a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the data line disposed between the first pixel unit and the second pixel unit, extends toward the first thin film transistor, and is electrically connected to a source/drain of the first thin film transistor by a first via hole of the first pixel unit.

In the display module of the present invention, when the first pixel unit and the second pixel unit are disposed parallel to each other in the second direction, a first branch electrode of the first pixel electrode spans across a scanning line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line disposed between the first pixel unit and the second pixel unit, extends toward the first thin film transistor, and is electrically connected to a source/drain of the first thin film transistor by a first via hole of the first pixel unit.

In the display module of the present invention, a first branch electrode of the first pixel electrode spans across a scanning line and a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line and the data line disposed between the first pixel unit and the second pixel unit, extends toward the first thin film transistor, and is electrically connected to a source/drain of the first thin film transistor by a first via hole of the first pixel unit.

In the display module of the present invention, the first pixel unit comprises a first color resistance;

the second pixel unit comprises a second color resistance; and the first color resistance and the second color resistance each are one of red color resistance, green color resistance, and blue color resistance.

In the display module of the present invention, the display panel comprises a display area and a non-display area disposed at a periphery of the display area;

wherein a plurality of thin film transistors are disposed parallel with each other in a first area of the non-display area, the first area is disposed adjacent to the display area, and the first area is parallel to a data line or a scanning line of the display area; and wherein the thin film transistors in the first area are electrically connected to the pixel electrode in the adjacent pixel unit.

In the display module of the present invention, the display area comprises a second area;

wherein the second area is opposite to and parallel to the first area, and the second area is adjacent to the non-display area and away from the first area;

wherein a plurality of thin film transistors are disposed parallel with each other in the second area; and wherein the thin film transistors in the second area are non-driving thin film transistors.

The beneficial effects of the invention: the present invention extends a pixel electrode in a pixel unit to a thin film transistor in an adjacent pixel unit through an area having a higher flatness. As a result, the alignment accuracy of the display panel is improved, the dark border of the display panel is eliminated, and the quality of the display panel is improved.

DESCRIPTION OF DRAWINGS

In order to further understand the features and technical details of the present invention, please refer to the following detailed description and drawings regarding the present invention. The drawings are provided for reference and description only and are not intended to limit the present invention.

DETAILED DESCRIPTION OF PREFERRED EMBODIMENTS

The following description of the various embodiments is provided to illustrate the specific embodiments of the invention. Directional terms mentioned in this application, such as "upper," "lower," "previous," "post," "left," "right," "inside," "outside," and "side" etc., are only references the direction of the drawing. Therefore, the directional terminology used is for the purpose of illustration and understanding, and is not intended to be limiting. In the drawings, structurally similar elements are denoted by the same reference numerals.

In order to further clarify the technical means and effects of the present invention, the following detailed description will be made in conjunction with the preferred embodiments of the invention and the accompanying drawings.

The embodiment of the present invention is described by using a color filter on array (COA) display panel 100 as an example.

The display panel 100 includes a first substrate, a second substrate, and a liquid crystal layer between the first substrate and the second substrate.

In this embodiment, the first substrate is an array substrate, and the color film layer is disposed on the array substrate.

Figure 1:
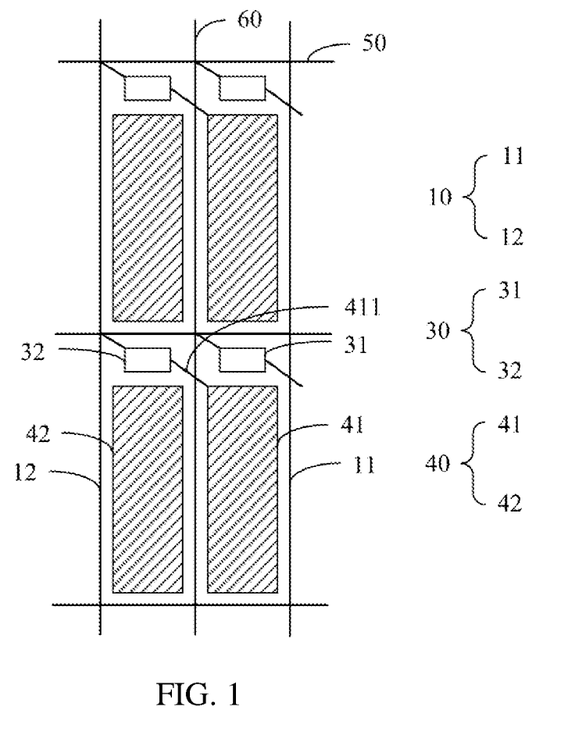
FIG. 1 is a first enlarged view of a pixel unit of a display panel in the present invention.

Please refer to FIG. 1, where FIG. 1 is a first enlarged view of a pixel unit of a display panel in the present invention.

The display panel 100 comprises at least two pixel units 10.

In the embodiment, each of the at least two pixel units 10 comprises a substrate 20, a thin film transistor (TFT) 30 disposed on the substrate 20, and a pixel electrode 40 disposed on the thin film transistor 30.

The thin film transistor 30 and the pixel electrode 40 disposed in a same pixel unit 10 are insulated from each other; and the thin film transistor 30 disposed in the same pixel unit 10 is electrically connected to a pixel electrode 40 disposed in another pixel unit 10, which is disposed parallel to the same pixel unit 10.

Figure 2:
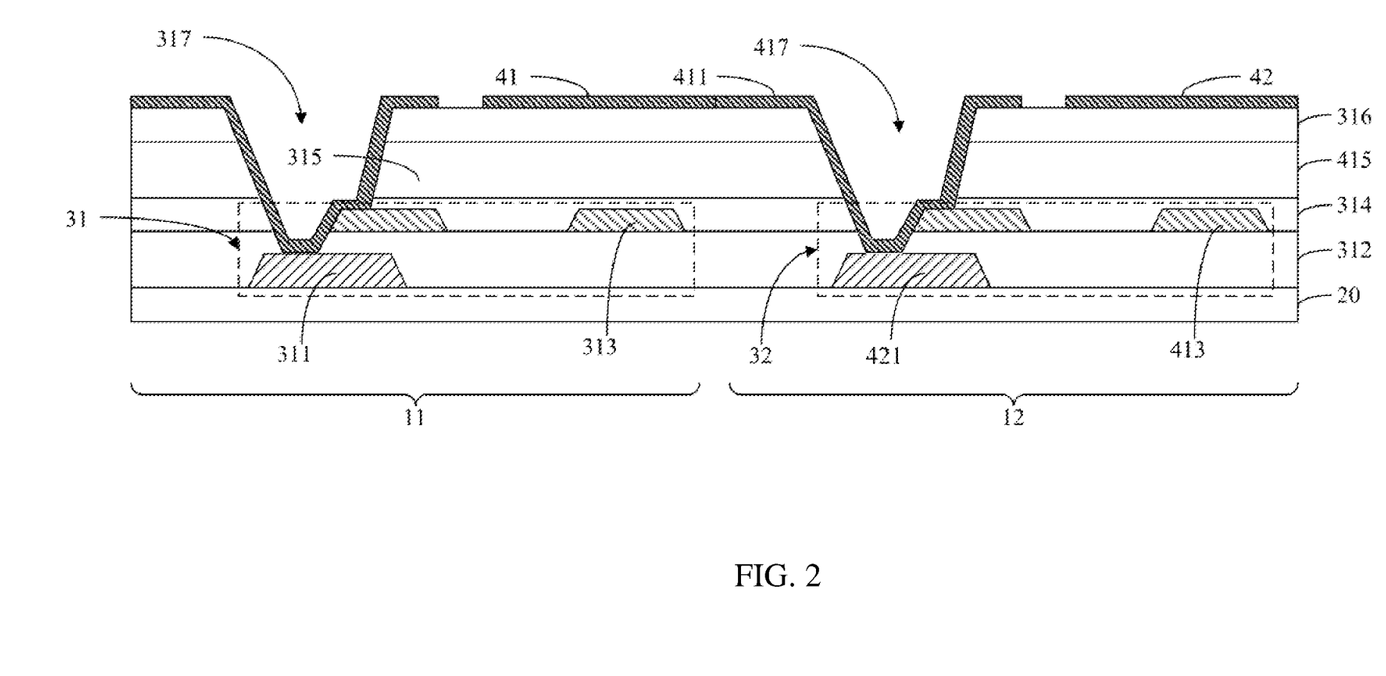
FIG. 2 is a structural view of an array substrate of the display panel in the present invention.

Please refer to FIG. 2. FIG. 2 is a structural view of an array substrate of the display panel in the present invention.

The display panel 100 includes at least a first pixel unit 11 and a second pixel unit 12.

In the embodiment, the first pixel unit 11 is disposed adjacent to the second pixel unit 12.

In the embodiment, a first pixel electrode 41 of a first pixel unit 11 of the at least two pixel units 10 is electrically connected to a second thin film transistor 32 of a second pixel unit 12 of the at least two pixel units 10, or a second pixel electrode 42 of the second pixel unit 12 is electrically connected to a first thin film transistor 31 of the first pixel unit 11.

Please refer to FIG. 2. The first pixel unit 11 includes a substrate 20, a first thin film transistor 31 disposed on the substrate 20, and a first pixel electrode 41 disposed on the first thin film transistor 31. The second pixel unit 12 includes a substrate 20, a second thin film transistor 32 disposed on the substrate 20, and a second pixel electrode 42 disposed on the second thin film transistor 32.

In the embodiment, the material of the substrate 20 may be one of a glass substrate, a quartz substrate, a resin substrate, and the like. When the substrate 20 is a flexible substrate, the material of the flexible substrate may be a polyimide (PI). The type of the substrate 20 is not specifically limited in the present invention.

The first thin film transistor and the second thin film transistor may be an etch barrier type, a back channel etch type, a bottom gate thin film transistor type or a top gate thin film transistor type, and the like, and the embodiment is not limited.

In the embodiment, the thin film transistor 30 in the pixel unit 10 is electrically connected to the pixel electrode 40 in the adjacent pixel unit 10. Alternatively, the pixel electrode 40 in the pixel unit 10 is electrically connected to the thin film transistor 30 in the adjacent pixel unit 10.

In the embodiment, at least one first branch electrode 411 of the first pixel electrode 41 extends toward the second thin film transistor 32 and is electrically connected to the second thin film transistor 32, or at least one second branch electrode of the second pixel electrode 42 extends toward the first thin film transistor 41 and is electrically connected to the first thin film transistor 41.

In the embodiment, the first pixel unit 11 and the second pixel unit 12 are disposed parallel to each other in a first direction or a second direction; and wherein the first direction is perpendicular to the second direction.

Please refer to FIG. 2, the present invention uses a bottom gate thin film transistor type as an example for description.

The first thin film transistor 31 includes a first gate layer 311 formed on the substrate 20, a gate insulating layer 312 formed on the first gate layer 311, a first source/drain layer 313 formed on the gate insulating layer 312, and a first passivation layer 314 formed on the first source/drain layer 313.

Since the array substrate is a COA substrate, the first pixel unit 11 further includes a first color resistance unit 315 formed on the first passivation layer 314, a second passivation layer 316 formed on the first color resistance unit 315, and a first pixel electrode 41 formed on the second passivation layer 316.

The second thin film transistor 32 includes a second gate layer 421 formed on the substrate 20, a gate insulating layer 312 formed on the second gate layer 421, a second source/drain layer 413 formed on the gate insulating layer 312, and a first passivation layer 314 formed on the second source/drain layer 413.

Since the array substrate is a COA substrate, the second pixel unit 12 further includes a second color resistance unit 415 formed on the first passivation layer 314, a second passivation layer 316 formed on the second color resistance unit 415, and a second pixel electrode 42 formed on the second passivation layer 316.

In the embodiment, the first pixel electrode 41 and the second pixel electrode 42 are formed in the same mask process, and the first pixel electrode 41 and the second pixel electrode 42 may be transparent electrode layers. The material of the first pixel electrode 41 and the second pixel electrode 42 may be indium tin oxide (ITO).

In the embodiment, the first thin film transistor 31 is electrically connected to the second pixel electrode 42 of the second thin film transistor 32.

Referring to FIG. 2, the first source/drain layer 313 of the first thin film transistor 31 is electrically connected to the second pixel electrode 42, or the second source/drain layer 413 of the second thin film transistor 32 is electrically connected to the first pixel electrode 41. This application uses this embodiment as a schematic diagram.

Referring to FIG. 1 and FIG. 2, when the first pixel unit 11 and the second pixel unit 12 are disposed parallel to each other in the first direction, a first branch electrode 411 of the first pixel electrode 41 spans across a data line 50 disposed between the first pixel unit 11 and the second pixel unit 12, extends toward the second thin film transistor 32, and is electrically connected to a source/drain of the second thin film transistor 32 by a second via hole 417 of the second thin film transistor 32.

In this embodiment, the first direction is parallel to the scan line 60.

In addition, this embodiment may further be that the second branch electrode of the second pixel electrode 42 spans across the data line 50 between the first pixel unit 11 and the second pixel unit 12, extends toward the first thin film transistor 31, and is electrically connected to the source/drain of the first thin film transistor 31 through the first via 317 of the first thin film transistor 31.

Figure 3:
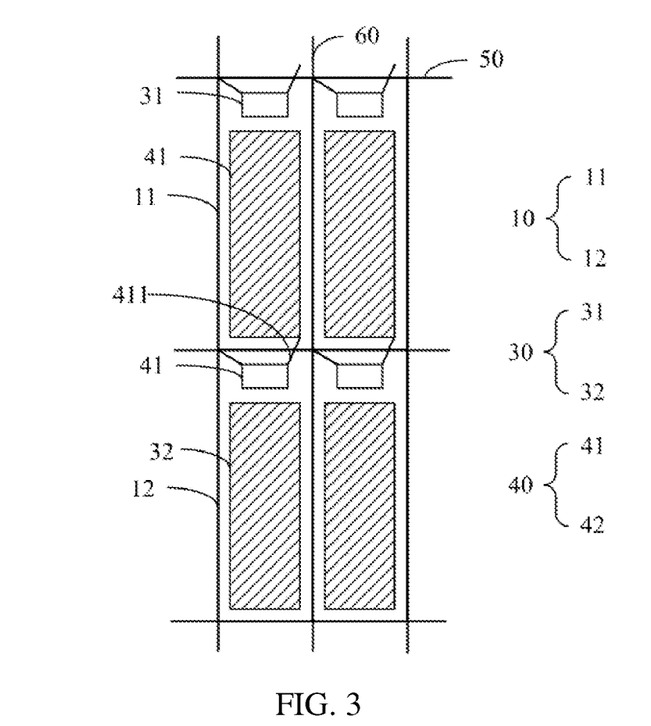
FIG. 3 is a second enlarged view of the pixel unit of the display panel in the present invention.

Please refer to FIG. 3. FIG. 3 is a second enlarged view of the pixel unit of the display panel in the present invention.

When the first pixel unit 11 and the second pixel unit 12 are disposed parallel to each other in the second direction, a first branch electrode 411 of the first pixel electrode 41 spans across a scanning line 60 disposed between the first pixel unit 11 and the second pixel unit 12, extends toward the second thin film transistor 32, and is electrically connected to a source/drain of the second thin film transistor 32 by a second via hole 417 of the second thin film transistor 32.

Please refer to FIG. 3. FIG. 3 is a second enlarged view of the pixel unit of the display panel in the present invention.

In addition, this embodiment may further be that a second branch electrode of the second pixel electrode 42 spans across the scanning line 60 disposed between the first pixel unit 11 and the second pixel unit 12, extends toward the first thin film transistor 31, and is electrically connected to a source/drain of the first thin film transistor 31 by a first via hole 317 of the first thin film transistor 31.

Figure 4:
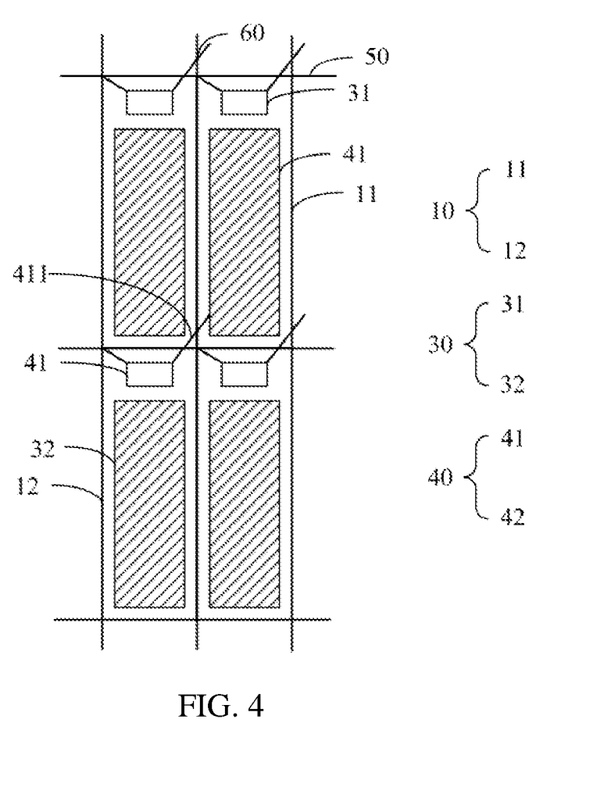
FIG. 4 is a third enlarged view of the pixel unit of the display panel in the present invention.

Please refer to FIG. 4, FIG. 4 is a third enlarged view of the pixel unit of the display panel in the present invention.

A first branch electrode 411 of the first pixel electrode 41 spans across a scanning line 60 and a data line 50 disposed between the first pixel unit 11 and the second pixel unit 12, extends toward the second thin film transistor 32, and is electrically connected to a source/drain of the second thin film transistor 32 by a second via hole 417 of the second thin film transistor 32.

In addition, this embodiment may further be that a second branch electrode of the second pixel electrode 42 spans across the scanning line 60 and the data line 50 disposed between the first pixel unit 11 and the second pixel unit 12, extends toward the first thin film transistor 31, and is electrically connected to a source/drain of the first thin film transistor 31 by a first via hole 317 of the first thin film transistor 31.

Figure 5:
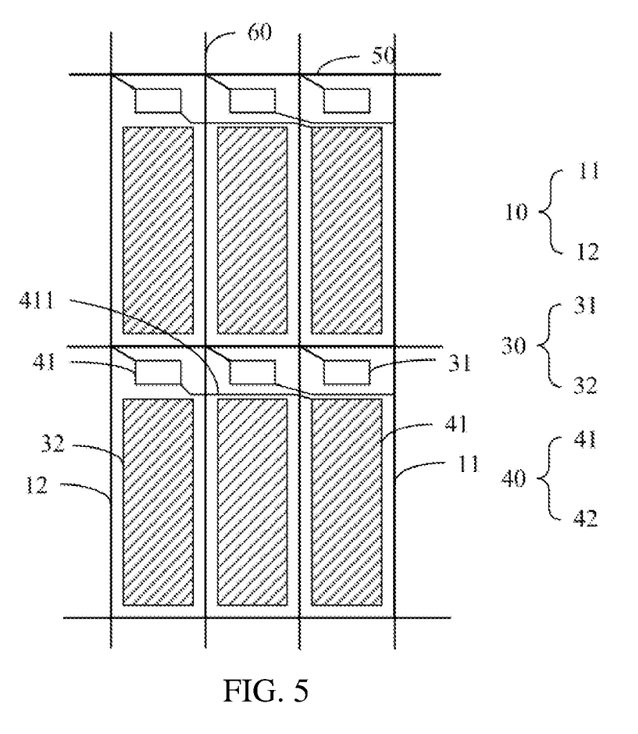
FIG. 5 is a fourth enlarged view of the pixel unit of the display panel in the present invention.

Please refer to FIG. 5. FIG. 5 is a fourth enlarged view of the pixel unit of the display panel in the present invention.

In this embodiment, the first source/drain layer of the first thin film transistor 31 is electrically connected to the second pixel electrode 42, or the second source/drain layer of the second thin film transistor 32 is electrically connected to the first pixel electrode 41.

At least one the other pixel unit 10 may be spaced apart from the first pixel unit 11 and the second pixel unit 12, which is not specifically limited herein.

In the above embodiment, since the display panel 100 is a COA display panel 100, the first pixel unit 11 thus further comprises a first color resistance 315, and the second pixel unit 12 further comprises a second color resistance 415. The first color resistance 315 and the second color resistance 415 each are one of red color resistance, green color resistance, and blue color resistance.

For example, if the pixels of the display panel 100 in the above embodiment are arranged as a standard RGB arrangement, then the color resistance units of the first pixel unit 11 and the second pixel unit 12 in FIG. 1 and FIG. 4 are different in color, and the color resistance units of the first pixel unit 11 and the second pixel unit 12 in FIG. 3 are the same color.

Figure 6:
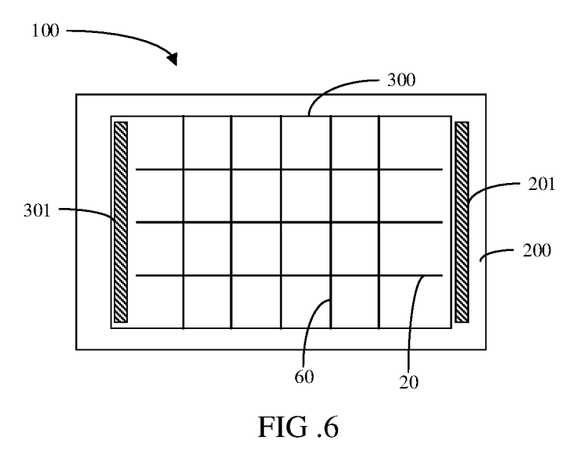
FIG. 6 is a plan view of the display panel in the present invention.

Please refer to FIG. 6. FIG. 6 is a plan view of the display panel in the present invention.

Figure 7:
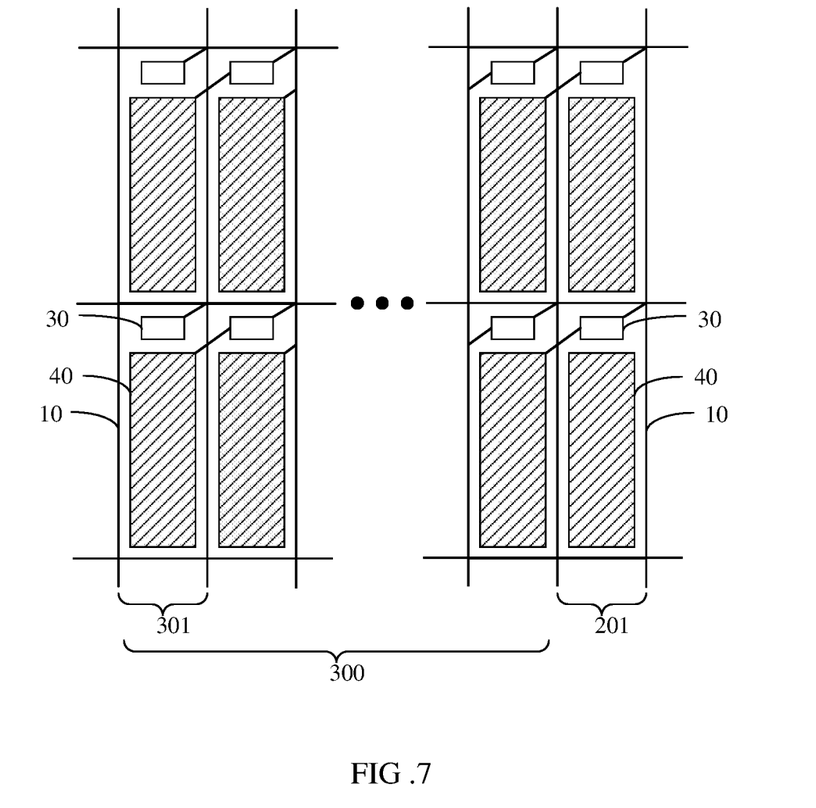
FIG. 7 is a fifth enlarged view of the pixel unit of the display panel in the present invention.

Please refer to FIG. 7. FIG. 7 is a fifth enlarged view of the pixel unit of the display panel in the present invention.

The display panel 100 comprises a display area 300 and a non-display area 200 disposed at a periphery of the display area 300.

The non-display area 200 includes a first area 201 disposed adjacent to the display area 300.

A plurality of thin film transistors 30 are disposed parallel with each other in the first area 201 of the non-display area 200, the first area 201 is parallel to a data line 50 or a scanning line 60 of the display area 300.

In the embodiment, the first area 201 is parallel to the data line 50 of the display region 300 as an example.

The thin film transistors 30 in the first area 201 are electrically connected to the pixel electrode 40 in the adjacent pixel unit 10.

The display area 300 comprises a second area 301 disposed adjacent to the non-display area 200.

The second area 301 is opposite to and parallel to the first area 201, and is away from the first area 201.

A plurality of thin film transistors 30 are disposed parallel with each other in the second area 301.

In the embodiment, the thin film transistors 30 in the second area 301 are non-driving thin film transistors 30.

In the embodiment, the thin film transistor 30 in the first area 201 is used to drive and be electrically connected to the pixel electrodes 40 in the row/column pixel units 10 of the display area 300. That is, the thin film transistor 30 in the first area 201 is used to drive the TFT. Therefore, the thin film transistor 30 in the second area 301 is not electrically connected to the pixel electrode 40 of the corresponding pixel units 10, and the thin film transistor in the second area 301 is an ineffective TFT.

In the present invention, the electrode lead of the pixel electrode in a certain pixel unit is extended to the adjacent pixel unit, and the wiring area across the flat data line or the scan line is electrically connected to the corresponding thin film transistor. As a result, the alignment accuracy of the display panel is improved, the dark border of the display panel is eliminated, and the quality of the display panel is improved.

This application is only described by taking a COA panel as an example. However, the technical solution of the present invention is applicable to any liquid crystal display panel.

The present invention also provides a display module, which includes the above display panel, and a polarizer layer and a cover layer on the display panel. The working principle of the display module is the same as or similar to that of the display panel, and details are not described herein again.

The present invention provides a display panel and a display module. The display panel comprises at least two pixel units. Each pixel units comprises a substrate, a thin film transistor disposed on the substrate, and a pixel electrode disposed on the thin film transistor. The thin film transistor and the pixel electrode disposed in the same pixel unit are insulated from each other. The thin film transistor disposed in the pixel unit is electrically connected to a pixel electrode disposed in another pixel unit, which is disposed parallel to the pixel unit. The present invention extends a pixel electrode in a pixel unit to a thin film transistor in an adjacent pixel unit through an area having a higher flatness. Therefore, the alignment accuracy of the display panel is improved, the dark border of the display panel is eliminated, and the quality of the display panel is improved.

In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising at least two pixel units, and further comprising a display area and a non-display area disposed at a periphery of the display area;
   wherein each of the pixel units comprises a substrate, a thin film transistor (TFT) disposed on the substrate, and a pixel electrode disposed on the thin film transistor;
   wherein the thin film transistor and the pixel electrode of each of the pixel units are insulated from each other, and the thin film transistor of each of the pixel units is electrically connected to the pixel electrode of one parallel pixel unit; and
   wherein a plurality of the thin film transistors are disposed in parallel with each other in a first area of the non-display area, the first area is disposed adjacent to the display area and is parallel to a data line or a scanning line in the display area, and the thin film transistors in the first area are electrically connected to the pixel electrodes in the adjacent pixel units.

2. The display panel as claimed in claim 1, wherein a first pixel electrode of a first pixel unit of the at least two pixel units is electrically connected to a second thin film transistor of a second pixel unit of the at least two pixel units, or a second pixel electrode of the second pixel unit is electrically connected to a first thin film transistor of the first pixel unit.

3. The display panel as claimed in claim 2, wherein at least one first branch electrode of the first pixel electrode extends toward the second thin film transistor and is electrically connected to the second thin film transistor, or at least one second branch electrode of the second pixel electrode extends toward the first thin film transistor and is electrically connected to the first thin film transistor.

4. The display panel as claimed in claim 3, wherein the first pixel unit and the second pixel unit are disposed parallel to each other in a first direction or a second direction; and
   wherein the first direction is perpendicular to the second direction.

5. The display panel as claimed in claim 4, wherein when the first pixel unit and the second pixel unit are disposed parallel to each other in the first direction, a first branch electrode of the first pixel electrode spans across a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the data line disposed between the first pixel unit and the second pixel unit, extends toward the first thin film transistor, and is electrically connected to a source/drain of the first thin film transistor by a first via hole of the first pixel unit.

6. The display panel as claimed in claim 3, wherein when the first pixel unit and the second pixel unit are disposed parallel to each other in the second direction, a first branch electrode of the first pixel electrode spans across a scanning line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line disposed between the first pixel unit and the second pixel unit, extends toward the first thin film transistor, and is electrically connected to a source/drain of the first thin film transistor by a first via hole of the first pixel unit.

7. The display panel as claimed in claim 3, wherein a first branch electrode of the first pixel electrode spans across a scanning line and a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line and the data line disposed between the first pixel unit and the second pixel unit, extends toward the first thin film transistor, and is electrically connected to a source/drain of the first thin film transistor by a first via hole of the first pixel unit.

8. The display panel as claimed in claim 3, wherein:
   the first pixel unit comprises a first color resistance;
   the second pixel unit comprises a second color resistance; and
   the first color resistance and the second color resistance each are one of red color resistance, green color resistance, and blue color resistance.

9. The display panel as claimed in claim 1, wherein the display area comprises a second area, the second area is opposite to and parallel to the first area, the second area is adjacent to the non-display area and away from the first area, a plurality of the thin film transistors are disposed in parallel with each other in the second area, and the thin film transistors in the second area are non-driving thin film transistors.

10. A display module, comprising a display panel, a polarized layer, and a cover layer, wherein the polarized layer and the cover layer are disposed on the display panel, and the display panel comprises at least two pixel units and further comprises a display area and a non-display area disposed at a periphery of the display area;
    wherein each of the pixel units comprises a substrate, a thin film transistor disposed on the substrate, and a pixel electrode disposed on the thin film transistor;
    wherein the thin film transistor and the pixel electrode of each of the pixel units are insulated from each other, and the thin film transistor of each of the pixel units is electrically connected to the pixel electrode of one parallel pixel unit; and
    wherein a plurality of the thin film transistors are disposed in parallel with each other in a first area of the non-display area, the first area is disposed adjacent to the display area and is parallel to a data line or a scanning line in the display area, and the thin film transistors in the first area are electrically connected to the pixel electrodes in the adjacent pixel units.

11. The display module as claimed in claim 10, wherein a first pixel electrode of a first pixel unit of the at least two pixel units is electrically connected to a second thin film transistor of a second pixel unit of the at least two pixel units, or a second pixel electrode of the second pixel unit is electrically connected to a first thin film transistor of the first pixel unit.

12. The display module as claimed in claim 11, wherein at least one first branch electrode of the first pixel electrode extends toward the second thin film transistor and is electrically connected to the second thin film transistor, or at least one second branch electrode of the second pixel electrode extends toward the first thin film transistor and is electrically connected to the first thin film transistor.

13. The display module as claimed in claim 12, wherein the first pixel unit and the second pixel unit are disposed parallel to each other in a first direction or a second direction; and wherein the first direction is perpendicular to the second direction.

14. The display module as claimed in claim 13, wherein when the first pixel unit and the second pixel unit are disposed parallel to each other in the first direction, the first branch electrode of the first pixel electrode spans across a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the data line disposed between the first pixel unit and the second pixel unit, extends toward the first thin film transistor, and is electrically connected to a source/drain of the first thin film transistor by a first via hole of the first pixel unit.

15. The display module as claimed in claim 12, wherein when the first pixel unit and the second pixel unit are disposed parallel to each other in the second direction, a first branch electrode of the first pixel electrode spans across a scanning line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line disposed between the first pixel unit and the second pixel unit, extends toward the first thin film transistor, and is electrically connected to a source/drain of the first thin film transistor by a first via hole of the first pixel unit.

16. The display module as claimed in claim 12, wherein a first branch electrode of the first pixel electrode spans across a scanning line and a data line disposed between the first pixel unit and the second pixel unit, extends toward the second thin film transistor, and is electrically connected to a source/drain of the second thin film transistor by a second via hole of the second pixel unit, or a second branch electrode of the second pixel electrode spans across the scanning line and the data line disposed between the first pixel unit and the second pixel unit, extends toward the first thin film transistor, and is electrically connected to a source/drain of the first thin film transistor by a first via hole of the first pixel unit.

17. The display module as claimed in claim 3, wherein:

the first pixel unit comprises a first color resistance;

the second pixel unit comprises a second color resistance; and the first color resistance and the second color resistance each are one of red color resistance, green color resistance, and blue color resistance.

18. The display module as claimed in claim 10, wherein the display area comprises a second area, the second area is opposite to and parallel to the first area, the second area is adjacent to the non-display area and away from the first area, a plurality of the thin film transistors are disposed in parallel with each other in the second area, and the thin film transistors in the second area are non-driving thin film transistors.

* * * * *